US008248690B2

(12) United States Patent
Harter

(10) Patent No.: US 8,248,690 B2
(45) Date of Patent: Aug. 21, 2012

(54) INEXPENSIVE VARIABLE REP-RATE SOURCE FOR HIGH-ENERGY, ULTRAFAST LASERS

(75) Inventor: Donald J. Harter, Ann Arbor, MI (US)

(73) Assignee: IMRA America, Inc., Ann Arbor, MI (US)

( * ) Notice: Subject to any disclaimer, the term of this patent is extended or adjusted under 35 U.S.C. 154(b) by 196 days.

(21) Appl. No.: 12/340,020

(22) Filed: Dec. 19, 2008

(65) Prior Publication Data

US 2009/0097520 A1    Apr. 16, 2009

Related U.S. Application Data

(62) Division of application No. 10/437,057, filed on May 14, 2003, now Pat. No. 7,330,301, and a division of application No. 12/003,153, filed on Dec. 20, 2007, now Pat. No. 7,483,204.

(51) Int. Cl.
    *H04B 10/17*    (2006.01)
    *H01S 3/00*    (2006.01)

(52) U.S. Cl. .......................... 359/341.1; 359/333; 372/25

(58) Field of Classification Search .................. 359/333, 359/341.1; 372/25
    See application file for complete search history.

(56) References Cited

U.S. PATENT DOCUMENTS

| | | | |
|---|---|---|---|
| 4,635,263 A * | 1/1987 | Mollenauer | 372/3 |
| 4,750,809 A | 6/1988 | Kafka et al. | |
| 4,896,326 A | 1/1990 | Kafka et al. | |
| 4,913,520 A | 4/1990 | Kafka | |
| 5,400,350 A | 3/1995 | Galvanauskas | |
| 5,541,947 A * | 7/1996 | Mourou et al. | 372/25 |
| 5,553,088 A | 9/1996 | Brauch et al. | |
| 5,627,853 A | 5/1997 | Mooradian et al. | |
| 5,745,284 A * | 4/1998 | Goldberg et al. | 359/344 |
| 5,778,015 A * | 7/1998 | Gunning et al. | 372/25 |
| 5,818,630 A | 10/1998 | Fermann | |
| 5,880,877 A * | 3/1999 | Fermann et al. | 359/341.31 |
| 5,956,171 A * | 9/1999 | Dennis et al. | 359/281 |
| 6,208,458 B1 * | 3/2001 | Galvanauskas et al. | 359/345 |
| 6,249,630 B1 * | 6/2001 | Stock et al. | 385/123 |
| 6,373,565 B1 | 4/2002 | Kafka et al. | |
| 6,400,495 B1 | 6/2002 | Zayhowski | |
| 6,404,964 B1 * | 6/2002 | Bhagavatula et al. | 385/123 |
| 6,421,573 B1 | 7/2002 | Kafka et al. | |
| 6,436,602 B1 | 8/2002 | Imahara et al. | |
| 6,728,273 B2 * | 4/2004 | Perry | 372/18 |
| 6,760,356 B2 * | 7/2004 | Erbert et al. | 372/93 |
| 6,885,683 B1 | 4/2005 | Fermann et al. | |
| 6,990,270 B2 | 1/2006 | Nicholson | |
| 2002/0170891 A1 * | 11/2002 | Boyle et al. | 219/121.67 |

(Continued)

OTHER PUBLICATIONS

M.E. Fermann, et al, "Ultrawide Tunable Er Soliton Fiber Laser Amplified in Yb-doped Fiber", Optics Letters, vol. 24, No. 20, Oct. 15, 1999, pp. 1428-1430.

(Continued)

*Primary Examiner* — Eric Bolda
(74) *Attorney, Agent, or Firm* — Sughrue Mion, PLLC

(57) ABSTRACT

System for converting relatively long pulses from rep-rate variable ultrafast optical sources to shorter, high-energy pulses suitable for sources in high-energy ultrafast lasers. Fibers with positive group velocity dispersion (GVD) and self phase modulation are advantageously employed with the optical sources. These systems take advantage of the need for higher pulse energies at lower repetition rates so that such sources can be cost effective.

21 Claims, 9 Drawing Sheets

U.S. PATENT DOCUMENTS

2003/0156605 A1* 8/2003 Richardson et al. ............ 372/25
2004/0263949 A1* 12/2004 Gu et al. ....................... 359/333

OTHER PUBLICATIONS

M.E. Ferman,, et al, "Self-Similar Propagation and Amplification of Parabolic Pulses in Optical Fibers", Physical Review Letters, vol. 84, No. 26, Jun. 26, 2000, pp. 6010-6013.

M.E. Fermann, et al, "Highly Efficient, Low-noise Yb Femtosecond Fiber Souce", CLEO, 2000, pp. 83-84.

T. Hirooka et al, "Parabolic Pulse Generation by Use of a Dispersion-decreasing Fiber with Normal Group-Velocity Dispersion", Optics Letters, vol. 29, No. 5, Mar. 1, 2004, pp. 498-500.

J.J. Zayhowski, et al., Gain-switched pulsed operation of microchip lasers, Optics Letters, Dec. 1, 1989, pp. 1318-1320, vol. 14, No. 23.

J.J. Zayhowski, et al., Miniature, Pulsed Ti:Sapphire Laser System, IEEE Journal of Quantum Electronics, Nov. 2002, pp. 1449-1454, vol. 38, No. 11.

B. Zysset, et al., 200-femtosecond pulses at 1.06 µm generated with a double-stage pulse compressor, Optics Letters, Mar. 1986, pp. 156-158, vol. 11, No. 3.

P.C. Becker, et al, Erbium-Doped Fiber Amplifiers, fundamentals and Technology, Academic, San Diego (1999), p. 239.

Pulse Compression by Non-linear Pulse Evolution with Reduced Optical Wave Breaking in Erbium-doped Fiber Amplifiers, K. Tamura et al, Optics Letters, vol. 21, No. 1, Jan. 1, 1996, pp. 68-70.

G.P. Agrawal, Nonlinear Fiber Optics, 1989, pp. 9-11 and 220 (Fig. 8.1), Academic Press, Inc., New York.

G.P. Agrawal, Nonlinear Fiber Optics, 1989, pp. 75-103, Academic Press, New York.

G.P. Agrawal, Nonlinear Fiber Optics, 1989 pp. 147-171, Academic Press, New York.

K.A. Ahmed, et al., Generation of 185fs pedestal-free pulses using a 1.55 µm distributed feedback semiconductor laser, Electronics Letters, Feb. 2, 1995, pp. 195-196, vol. 31, No. 3.

B. Braun, et al., 56-ps passively Q-switched diode-pumped microchip laser, Optics Letters, Mar. 15, 1997, pp. 381-383, vol. 22, No. 6.

T. Damm, et al., Compression of picosecond pulses from a solid-state laser using self-phase modulation in graded-index fibers, Optics Letters, Apr. 1985, pp. 176-178, vol. 10, No. 4.

E.M. Dianov, et al., Generation of high-contrast subpicopulses by single-stage 110-fold compression of YAG:Nd$^{3+}$ laser pulses, Soviet Journal of Quantum Electronics, Apr. 4, 1987, pp. 415-416, vol. 17, No. 4.

R.L. Fork, et al., Compression of optical pulses to six femtoseconds by using cubic phase compensation, Optics Letters, Jul. 1987, pp. 483-485, vol. 12, No. 7.

K. Furusawa, et al., Cladding pumped Yterrbium-doped fiber laser with holey inner and outer cladding, Optics Express, Dec. 17, 2001, pp. 714-720, vol. 9, No. 13.

D.J. Harter, et al., Short Pulse Generation from Ti:Doped Materials, Digest of Conference on Lasers and Electro-Optics, 1988, pp. 466-467.

J.P. Heritage, et al., Spectral windowing of frequency-modulated optical pulses in a grating compressor, Applied Physics Letters, Jul. 15, 1985, pp. 87-89, vol. 47, No. 2.

S.T. Knudsen, Design and manufacture of dispersion compensating fibers and their performance in systems, S. Proc. of OFC, Mar. 20, 2002, pp. 330-331.

M. Kuckartz, et al., Operation of a fiber-grating compressor in the Raman regime, Optical Society of America, Jul. 1988, pp. 1353-1359, vol. 5, No. 7.

J. Kwon, et al., Group-Delay-Tailored Chirped Fiber Bragg Gratings Using a Tapered Elastic Plate, IEEE Photonics Technology Letters, Oct. 10, 2002, pp. 1433-1435, vol. 14, No. 10.

D. Mestdah, Fiber-grating pulse compressor: Performance with initially chirped pulses, Applied Optics, Dec. 15, 1987, pp. 5234-5240, vol. 26, No. 24.

H. Nakatsuka, et al., Nonlinear Picosecond-Pulse Propagation through Optical Fibers with Positive Group Velocity Dispersion, Physical Review Letters, Sep. 28, 1981, pp. 910-913, vol. 47, No. 13.

M. Nakazawa, et al., Ultrahigh-Speed OTDM Transmission beyond 1 Tera Bit-Per-Second Using a Femtosecond Pulse Train, IEICE Trans. Electron., Jan. 1, 2002, pp. 117-125, vol. E85-C, No. 1.

K.R. Tamura, et al., 50-GHz repetition-rate, 280-fs pulse generation at 100-mW average power from a mode-locked laser diode externally compressed in a pedestal-free pulse compressor, Optics Letters, Jul. 15, 2002, pp. 1268-1270, vol. 27, No. 14.

R.N. Thurston, et al., Analysis of Picosecond Pulse Shape Synthesis by Spectral Masking in a Grating Pulse Compressor, IEEE Journal of Quantum Electronics, May 5, 1986, pp. 682-696, vol. QE-22, No. 5.

W.J. Tomlinson, et al., Limits of fiber-grating optical pulse compression, Journal of the Optical Society of America, Sep. 1987, pp. 1404-1411, vol. 4, No. 9.

W.J. Tomlinson, et al., Compression of optical pulses chirped by self-phase modulation in fibers, Journal of the Optical Society of America, Apr. 1984, pp. 139-149, vol. 1, No. 2.

J.A.R. Williams, The Compression of Optical Pulses Using Self-Phase-Modulation and Linearly Chirped Bragg-Gratings in Fibers, IEEE Photonics Technology Letters, May 1995, pp. 491-493.

J.J. Zayhowski, et al., Coupled-cavity electro-optically Q-switched Nd:YVO$_4$ microchip lasers, Optics Letters, Apr. 1, 1995, pp. 716-718, vol. 20, No. 7.

J.J. Zayhowski, et al., Diode-pumped passively Q-switched picosecond microchip lasers, Optics Letters, Sep. 15, 1994, pp. 1427-1429, vol. 19, No. 18.

K.A. Ahmed, et al., "Generation of 185fs pedestal-free pulses using a 1.55 µm distributed feedback semiconductor laser," Electronics Letters, Feb. 2, 1995, pp. 195-196, vol. 31, No. 3.

K.R. Tamura, et al., "50-GHz repetition-rate, 280-fs pulse generation at 100-mW average power from a mode-locked laser diode externally compressed in a pedestal-free pulse compressor," Optics Letters, Jul. 15, 2002, pp. 1268-1270, vol. 27, No. 14.

J.A.R. Williams "The Compression of Optical Pulses Using Self-Phase-Modulation and Linearly Chirped Bragg-Gratings in Fibers," IEEE Photonics Technology Letters, May 1995, pp. 491-493.

JP2006-532507 English Translation of rejection- Sep. 21, 2010.

JP2006-532507 Partial English Translation of Response to Office Action filed Mar. 22, 2011.

JP2006-532507 English Translation of claims as of Mar. 22, 2011.

* cited by examiner

INEXPENSIVE VARIABLE REP-RATE SOURCE FOR HIGH-ENERGY, ULTRAFAST LASERS

This is a divisional of application Ser. No. 12/003,153 filed Dec. 20, 2007, which is a divisional of application Ser. No. 10/437,057 filed May 14, 2003, now U.S. Pat. No. 7,330,301. The entire disclosure of the prior application, application Ser. No. 12/003,153 is hereby incorporated by reference.

BACKGROUND OF THE INVENTION

1. Field of the Invention

The present invention relates to rep-rate variable, ultrafast optical sources that have energies suitable for applications in high-energy, ultrafast laser systems. These sources may replace mode-locked lasers for generating short pulses for higher energy applications. The sources are based on inexpensive longer pulse sources and utilize pulse compression in optical fibers to obtain shorter pulses at high pulse energies.

2. Description of the Related Art

The present invention relates to a source for high-energy, ultrafast lasers. Most of the related art is focused on sources for telecommunications. Presently, there is a push to develop technology that allows an increase in the data to be transmitted by a fiber for telecommunications. There are two means for increasing the data rate. One is by increasing the number of channels, where the channels are at different wavelengths (WDM). The other is by increasing the data rate per channel by increasing the frequency of the data (TDM). Presently installed systems typically run at 10 Gigabits-per-sec (Gbit/s) and below, however, there is significant progress in developing systems that operate at 40 Gbit/s and 160 Gbit/s. The present state of the art is an experimental system that operates at 1.28 Terabit-per-sec (Tbit/s) for one channel (Nakazawa et al, "Ultrahigh-speed OTDM Transmission beyond 1 Tera Bit-Per-Second Using a Femtosecond Pulse Train" IECE Trans. Electron. E38-C, pp. 117-125, (2002)).

There are many technical challenges in increasing the frequency of telecommunication systems. The one that is relevant here is the optical source of the high frequency pulses. The present optical source is a cw laser diode having its output modulated with a lithium niobate amplitude modulator. The laser diode can be directly modulated, however, direct modulation of the diode typically imposes a spectral chirp on the laser diode output that degrades the signal after propagation some distance down a fiber. It is not certain that lithium niobate modulators and the related electronics will be able to reach the frequencies and picosecond and subpicosecond pulse widths needed for the systems of the future. Therefore research on alternative sources is presently very active. The alternative sources can be categorized into three areas. The first two are laser diode based devices where the thrust of the research is to improve the fidelity of the pulses generated. One category of such devices are mode-locked laser diodes where the frequency is determined by the round trip time of the laser cavity. The other category of laser diode based devices is gain switched laser diodes where the frequency is determined by the electronics. In order to get short pulses from gain switched diodes, the pulses need to be compressed after the diodes. This is normally accomplished by soliton compression in fibers.

The third category of sources are mode-locked fiber lasers. Mode-locked fiber lasers generally give high quality pulses but operate at lower frequencies than 40-160 GHz. The reason for the lower repetition rate is there is normally only one pulse in the cavity of a mode-locked laser and the cavity of the fiber laser needs to be long for sufficient gain from the fiber. The thrust of mode-locked fiber laser research is to increase the frequency of these devices by methods such as higher harmonic mode locking.

The configuration that is related to the present invention is the gain switched diode followed by a fiber for soliton pulse compression. An early example is in (Ahmed et al, "Generation of 185 fs pedestal-free pulses using a 1.55 µm distributed feedback semiconductor laser" Electronic Letters 31, pp 195-196, (1995)). The potential to generate variable and low rep rates from gain switched diodes with external pulse compression would be advantageous for using these devices in high-energy systems. The soliton pulse compression technique normally used is adiabatic soliton compression in dispersion decreasing fiber. A dispersion decreasing fiber is a fiber that has its core slowly decreased. In order to remain a soliton with decreasing dispersion the pulse width must slowly decrease. Pulse compression in dispersion decreasing fiber usually gives good pulse quality and pulse compression factors up to 16. A disadvantage with the present telecom gain-switched diode designs is due to the low pulse energies required and generated. Under these conditions, the nonlinearity for fiber pulse compression is small and so the fibers are usually quite long and expensive, particularly if the fiber is dispersion decreasing fiber. Often a fiber that corrects the chirp of the laser diodes is also required before the dispersion decreasing fiber. This is often near a kilometer long. In addition, a non-linear optical device is also often required to remove a long pulse pedestal after the fiber pulse compressor. Such a device is described in (K. Tamura et al, "50 GHz repetition-rate, 280-fs pulse generation at 100 mw average power from a mode-locked laser diode externally compressed in a pedestal-free pulse compressor" Optics Letters, 27 pp. 1268-70 (2002)) This three element compressor in addition to the diode makes these systems expensive.

The desired properties for the optical sources of this invention are the ability to produce picosecond and subpicosecond pulses with variable repetition-rates and with energies suitable for further amplification to create energetic, ultrafast pulses. Another desired feature is low cost. These sources will be used in ultrafast sources that have many applications. A few of the applications now being pursued are femtosecond micromachining, refractive index alteration in transparent materials for optical memory and photonic devices, three-dimensional integrated optics and photonic crystals, eye surgery, dentistry, dermatology and microsurgery. For these applications, the pulse characteristics are quite different than for telecom systems. Instead of picojoule pulse energies and >1 GHz repetition rates, pulse energies in the microjoule to millijoule range are desired with repetition rates from 1 kHz to 1 MHz. Chirped pulse amplification is used to accommodate the high energies in the fiber amplifier. In chirped pulse amplification the pulse is first spectrally chirped and thus temporally lengthened to keep the peak power lower in the fiber during amplification. After amplification, the pulse is recompressed. Chirped pulse amplification in fibers is described (Galvanauskas, "Method and Apparatus for generation high energy ultrashort pulses" U.S. Pat. No. 5,400, 350). The source in this patent is a laser diode that is electronically chirped to give a 1 ns pulse that was amplified and then compressed to ~2 ps. It is highly desirable to be able to obtain even shorter pulses. The source of pulses for chirped pulse amplification has been predominately femtosecond mode-locked fiber or solid-state lasers that operate at 50-100 MHz. These sources are typically down-counted; e.g., for 1 kHz operation, one pulse out of 50,000-100,000 is amplified. A source that could be operated at variable and lower frequencies would be more suitable.

Femtosecond mode-locked fiber lasers do not normally have sufficient pulse energies and the pulses are often longer than desired for these nontelecom sources. Soliton compression (narrowing) during amplification in a fiber amplifier and higher-order soliton compression have already been utilized with these sources. Soliton narrowing during amplification is equivalent to decreasing the dispersion in the fiber. As the pulse peak power is increased the pulse width needs to decrease to maintain the soliton. Such pulse compression for higher-energy pulses is described in (Fermann, Galvanauskas and Harter, "Apparatus and Method for the Generation of High-Power Femtosecond Pulses from a Fiber Amplifier" U.S. Pat. No. 5,880,877). The fiber amplifier can be less than a meter and soliton compression is built into this amplifier. A pulse is seeded into a fiber amplifier and it is amplified to energies of higher order solitons. As the higher order soliton propagates in a fiber its pulse width is periodic. During this periodic evolution, the pulse initially contracts by a factor dependent on the order of the soliton. It is this phenomenon that is used for compression. A compression factor of 100 can be obtained by this method but typically a smaller factor is used since pulse energy and length becomes too sensitive. A means to get to even higher pulse energies with soliton compression is described in U.S. Pat. No. 5,880,877. Higher energies are possible by utilizing a multimode fiber to propagate a single transverse mode. The intensity in the fiber is decreased since the multimode fiber has a larger mode area for the fundamental mode compared to a single mode fiber. Thus, higher pulse energies are necessary before soliton effects again become important.

An alternative to soliton compression in an optical fiber with negative group velocity dispersion (GVD) is pulse compression with a fiber having positive GVD. Just as with soliton compression, there is a balance of dispersion with self-phase modulation in the fiber. There is simultaneously spectral broadening of the pulse by self-phase modulation with temporally stretching of the pulse to give a linear spectral chirp by dispersion. After the fiber, the chirped pulse is recompressed. The first experiments in compression of ultrashort pulses with optical fibers were accomplished in this manner. In the first experiment by (Nakatsuka et al, "Nonlinear Picosecond-Pulse Propagation through Optical Fibers with Positive Group Velocity Dispersion", Physical Review Letters 47, pp. 910-913 (1981)), 5.5 picosecond pulses from a mode-locked dye laser were compressed to 2 ps giving a compression factor of 2.75. In the following six years significant progress was made in pulse compression utilizing this method until (Fork et al, "Compression of optical pulses to six femtoseconds by using cubic phase compensation" Optics Letters 12 pp. 483-5 (1987)) pulses were compressed to the long-standing record of 6 femtoseconds. The maximum pulse compression demonstrated is around 110× in one stage of compression. (Dianov, "Generation of high-contrast subpicopulses by single-stage 110-fold compression of YAG:Nd3+ laser pulses", Soviet Journal of Quantum Electronics, 17, pp. 415-416, (1987). Compression factors as high as 450 have been reported with a two stage fiber-grating compressor in (Zysst et al, "200-femtosecond pulses at 1.06 µm generated with a double-stage pulse compressor" Optics Letters 11 pp. 156-8 (1986)). This compression method has been commercialized for pulse compression of cw mode-locked Nd:YAG lasers operating at 1.06 µm. The pulse widths from these lasers are between 30-100 ps and the pulses are compressed normally by a factor of 100 to the subpicosecond range. The details of these systems can be found in (Kafka et al, "Pulse compression" U.S. Pat. No. 4,750,809, Kafka et al, "Peak power fluctuations in optical pulse compression", U.S. Pat. No. 4,896,326 and Kafka et al "Optical fiber for pulse compression" U.S. Pat. No. 4,913,520). This compression method has not been applied to gain switched diodes for telecom systems since fibers at the telecom wavelengths (~1.5 µm) are not normally positively dispersive, and soliton compression is less sensitive to amplitude fluctuations and does not require additional gratings for compression. However, the most important factor is the required peak power. For this compression method orders of magnitude higher pulse energies are required compared to soliton compression.

More recently, pulse compression utilizing positively dispersive amplifying fiber has generated nanojoule-range pulse energies for non-telecommunication applications. One method is described in U.S. patent application Ser. No. 09/576,772. This application describes primarily the use of parabolic pulse amplification. It does describe some pulse compression (2-10×) for seed pulses with a pulse width of 0.2-1 ps. It does not describe the pulse compression of pulses longer than 1 picosecond such as are generated from laser diodes or microchip lasers. (M. E. Fermann, A. Galvanauskas and D. Harter, "Single-mode amplifiers and compressors based on multimode optical fibers", U.S. Pat. No. 5,818,630) also teaches using positive GVD MM amplifier or undoped fibers for pulse compression. It does not teach parabolic pulse amplification or pulse compression for the pulses from gain switched laser diodes or microchip lasers that are the initial sources for the rather long pulses. For higher energies pulse compressors using positive GVD fibers that are multimode have been used. Pulse compressors utilizing multimode, positive GVD graded-index fibers has been used for initial pulse energies as high as 2 microjoules in (Damm et al, "Compression of picosecond pulses from a solid-state laser using self-phase modulation in graded-index fibers", Optics Letters 10, pp. 176-8, (1985)). However, in this case, the output was multi-transverse mode. Pulse compressors utilizing multimode, positive GVD fibers with single-mode output are described in (Fermann and Harter, "Single-mode amplifiers and compressors based on Multi-mode fibers", U.S. Pat. No. 5,818,630). The highest pulse energy utilized in compression with single mode operation of multimode fibers was in the nanojoule regime.

The sources of the initial pulses in this invention are gain switched laser diodes and microchip lasers. Gain switched laser diodes are described in the previously mentioned paper by Ahmed et al. A microchip laser is a small diode pumped solid-state laser. The microchip is either actively Q-switched or passively Q-switched. A commonly used passively Q-switch design is given in (Zayhowski et al., "Diode-pumped passively Q-switched picosecond microchip lasers", Optics Letters 19, pp. 1427-29 (1994)). The microchip laser that was used in this invention is described in (Zayhowski et al., "Coupled-cavity electro-optically Q-switched NdYVO4 microchip lasers", Optics Letters 20, pp. 716-8 (1995)). Pulse widths as low as 115 ps have been demonstrated for this actively Q-switched laser. In (Braun et al., "56-ps passively Q-switched diode-pumped microchip laser", Optics Letters, 22 pp 381-2, (1997)) 56 ps pulses from a passively Q-switched laser were obtained.

SUMMARY OF THE INVENTION

One object of this invention is to convert relatively long pulses from rep-rate variable ultrafast optical sources to shorter, high-energy pulses suitable for sources in high-energy ultrafast lasers. Another object of this invention is to take advantage of the need for higher pulse energies at lower repetition rates so that such sources can be cost effective.

A gain switched laser diode as is used in telecom systems can be used as the initial source of pulses. In this case, the diode is operated at a much lower repetition rate. The pulses are still amplified in fiber amplifiers. Fiber amplifiers can be used as constant output power devices. The upper-state lifetime in typical doped amplifier fibers such as Ytterbium and Erbium is in the millisecond range so that these amplifiers can amplify pulse trains with the same efficiency at repetition rates from 10's of kHz to 100's of GHz and beyond. If the amplifier is amplifying pulses at 10 kHz rather than at 10 GHz at constant power, then the pulse energy will be six orders of magnitude higher. Again, with such high peak powers, pulse compression methods need to be different and unique. A first embodiment uses conventional compression by spectral broadening the pulses in an optical fiber with positive group velocity dispersion (GVD) and then compressing the pulse with diffraction gratings. The object of the pulse compression is to convert the 3-25 picosecond pulses from the gain switched laser diode to pulses that are subpicosecond.

The second source starts with pulses from a low cost Q-switched microchip laser. These lasers give pulses as short as 50 picoseconds but typically 250 picoseconds to 1.0 nanosecond. The pulse peak powers are typically 1-10 kW with pulse energies 6 orders of magnitude higher than from telecom laser diodes. Microchip lasers could be a very cost effective source for pulses less than 10 picoseconds with suitable pulse compression methods. Single mode fiber compression has thus far been limited to pulses shorter than 150 ps and peak powers less than 1 kW.

DETAILED DESCRIPTION OF PREFERRED EMBODIMENTS

By way of example, eight preferred embodiments of the present invention are described herein. The first five embodiments use a laser diode as the source of long pulses for these ultrafast sources. The remaining embodiments use a microchip laser for the source of the long pulses.

The initial source of pulses is a laser diode operating in the telecom window at 1550 nm. This laser diode can be a diode used normally as a telecom pulse source. It can be internally modulated, gain switched, or externally modulated by utilizing a lithium niobate or electro-absorption modulator. The pulses need to be in the 1-100 picosecond range. The major difference in operation of this laser from the use in telecom systems is that the repetition rate will be in the kHz to MHz range rather than the GHz range.

The pulse is then amplified in a fiber amplifier. This amplifier uses positive dispersion fiber at least for the later section of the amplifier. The amplifier is designed so that pulse compression will occur by means of spectral generation along the fiber as the pulse is temporally chirped. At the end of the fiber, the pulse is typically recompressed with a diffractive element such as diffraction gratings, prisms, or a fiber grating. If the source is to be further amplified then chirped pulse amplification will be used so no pulse compression is needed at this point or the pulse may need to be further chirped using a diffractive element before amplification.

The design of the fiber compressor can be found with the following equations. These equations can be found in Govind P. Agarwal, Nonlinear Fiber Optics, Academic Press Inc. Boston 1989 Chapter 6

$$Z_0 = \pi T_0^2 / 2|\beta_2|$$

$$N^2 = \gamma P_0 T_0^2 / |\beta_2|$$

$$Z_{opt}/Z_0 \approx 1.6/N$$

$$\gamma = 2\pi n_2 / \lambda A_{eff}$$

$$1/F_c \approx 1.6/N$$

$Z_0$ is the soliton period or in this case where solitons do not propagate, it is the propagation distance in a fiber with a group-velocity dispersion parameter of $\beta_2$ where a pulse of temporal width $T_0$ doubles in temporal width. N would be the Soliton order for a pulse with peak power $P_0$ in a fiber with a nonlinear coefficient, $\gamma$. $\gamma$ is a function of the wavelength of the pulse $\lambda$, the nonlinear refractive index coefficient, $n_2$, of the material in the fiber and the effective area, $A_{eff}$, of the guided light in the fiber. $F_c$ is the compression factor.

Figure 1A:
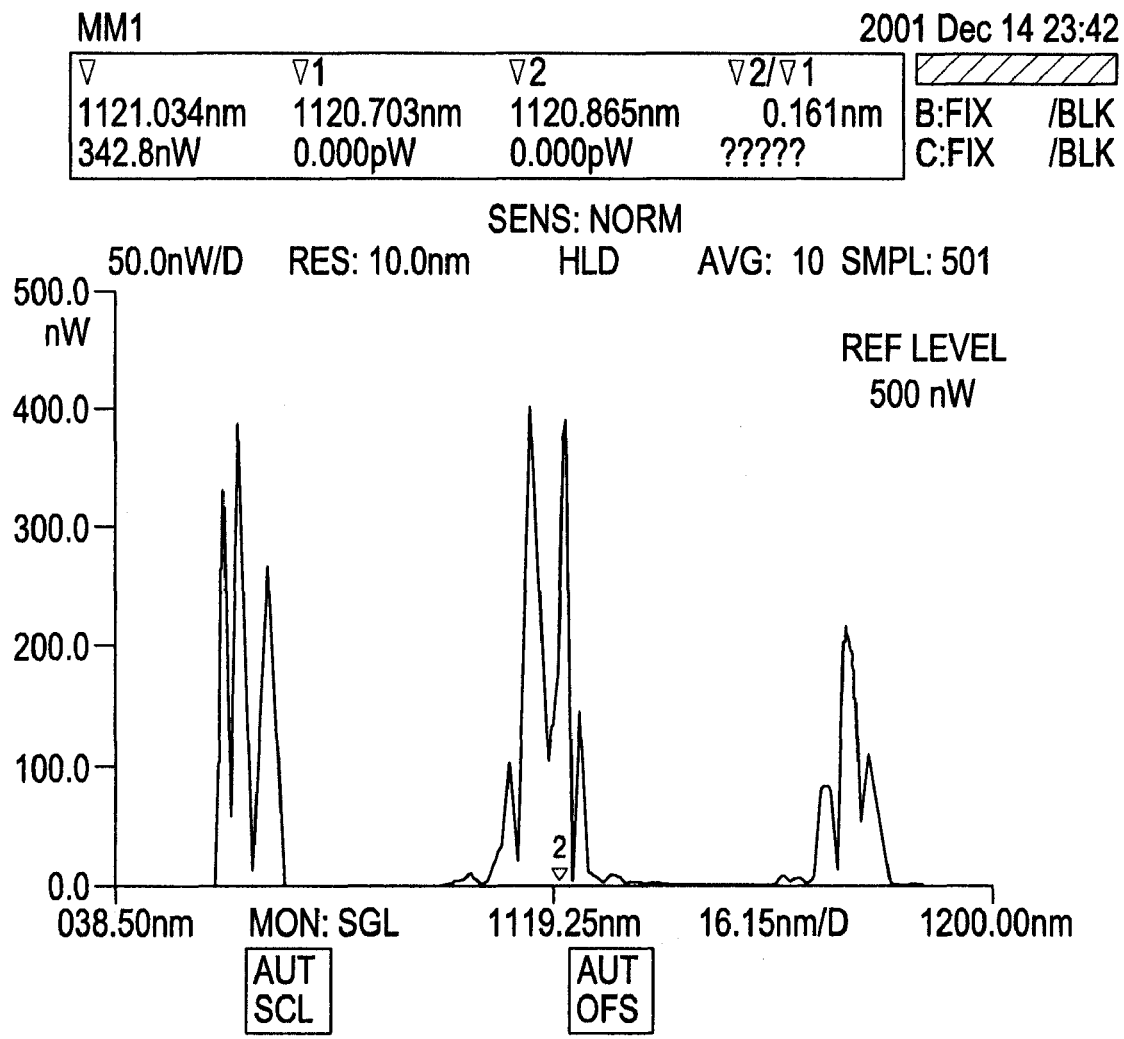
FIG. 1A shows an example of an output from a single mode silica fiber having a laser pulse propagating therethrough.
Figure 1B:
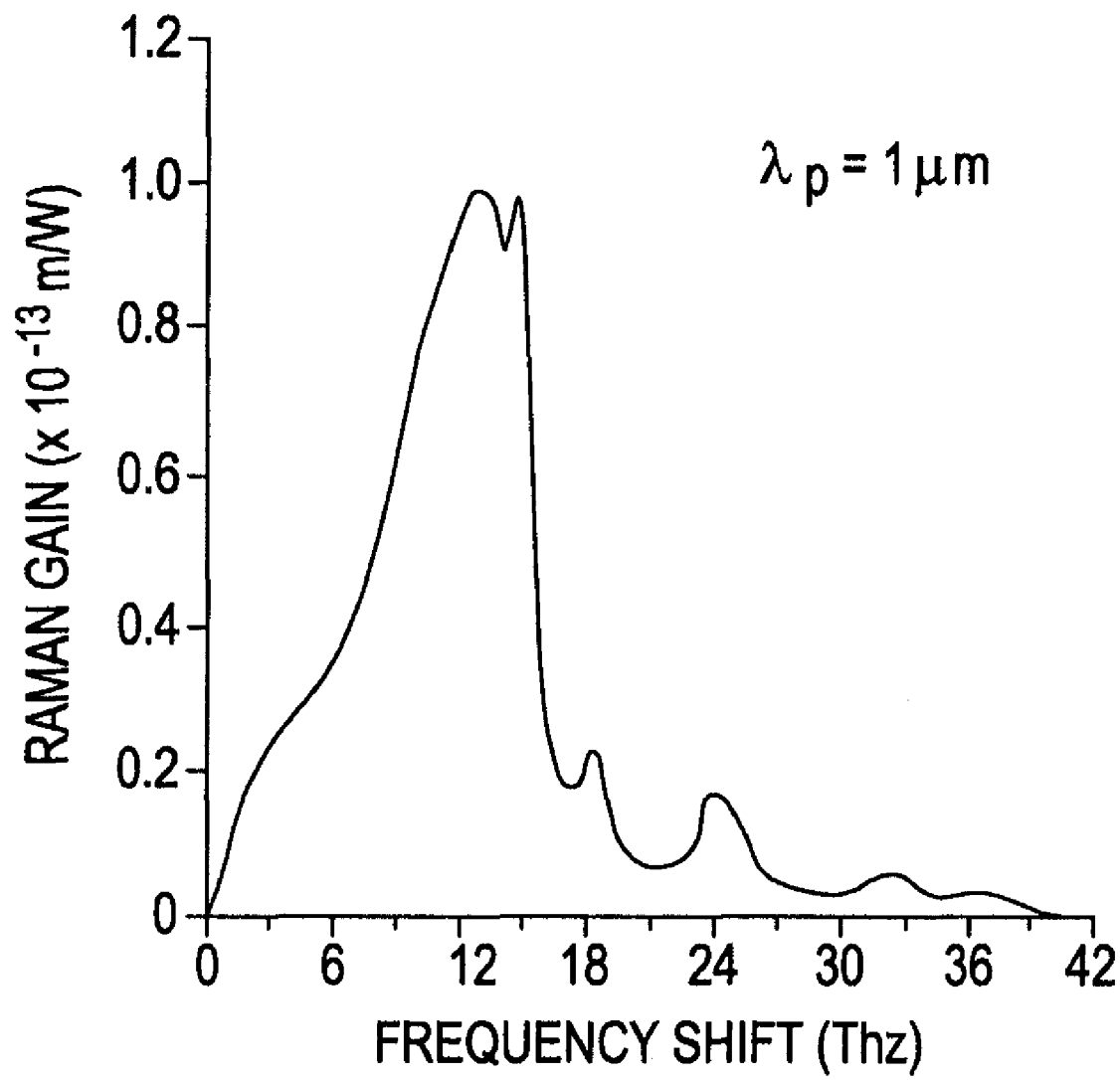
FIG. 1B shows the Raman gain curve in silica.

In the design of these fiber compressors, it is necessary to avoid the conversion of the pulse to other frequencies by Raman generation. This actually limits the pulse compression factor to about 100. A somewhat higher compression factor of 130 was obtained in the Raman regime (see Kuckkartz et al, "Operation of a fiber-grating compressor in the Raman regime" Journal of the Optical Society B, 5, pp. 1353-1359 (1988)). At some point the stimulated Raman converts the pulse to a longer wavelength, reduces efficiency and prevents higher compression factors. The Raman gain curve in silica can be seen in FIG. 1B (Govind P. Agarwal, Nonlinear Fiber Optics, Academic Press Inc. Boston 1989 FIG. 8.1). Stimulated Raman shifts the output spectra by 12 THz. FIG. 1A shows the output from a single mode silica fiber when a one microjoule, 250 ps pulse from a 1.064 nm microchip laser propagates in 100 meters of single mode fiber. There is spectral broadening at 1.065 μm. The multiple-lobed spectrum is indicative of self-phase modulation. However, significant energy is converted to the first Stokes Raman wavelength at 1.12 μm and the second Stokes Raman wavelength at 1.18 μm. The peak power limits can be calculated. The Raman threshold is a peak power effect and is determined by:

$$P_{thresh} = 16 A_{eff}/g_{raman}L_{eff}$$

Stimulated Raman will grow from noise when the gain is equal to exp(16) and the gain coefficient for Raman is $g_{raman}L_{eff}P_{thresh}/A_{eff}$ where $g_{raman}$ is the coefficient for Raman gain and is 3.5×10⁻¹² cm/W in silica glass, $A_{eff}$ is the mode area, $P_{thresh}$ is the threshold peak power and $L_{eff}$ is the effective length of the fiber. The effective length is modified in a high gain amplifier since the peak power is only high near the end of the fiber. The formula is:

$$L_{eff} = 1/g(1-\exp(-gL))$$

where g is the gain coefficient of the fiber amplifier and L is the physical fiber length. Increased performance can be obtained by utilizing fibers designed to prevent propagation of longer wavelengths such as reported in (Arbore et al, "S-band Erbium-Doped Fiber Amplifiers for WDM Transmission Between 1488 and 1508 nm" in OSA Trends in Optics and Photonics (TOPS) Vol. 86, Optical Fiber Communication Conference, Postconference Edition (Optical Society of America, Washington, D.C., 2003), pp. 374-376.) The fiber described in this reference is a "depressed-cladding design" to create a fundamental-mode cut off above the wavelength of operation. Another solution to provide loss to longer wavelengths to prevent Raman generation is a series of filters along the length of fiber. (Etsuko Ishikawa et al, in Proceedings of ECOC 2001 (2001), Post-Deadline paper). These fibers can also be used in fiber amplifiers to obtain higher peak powers.

Figure 2:
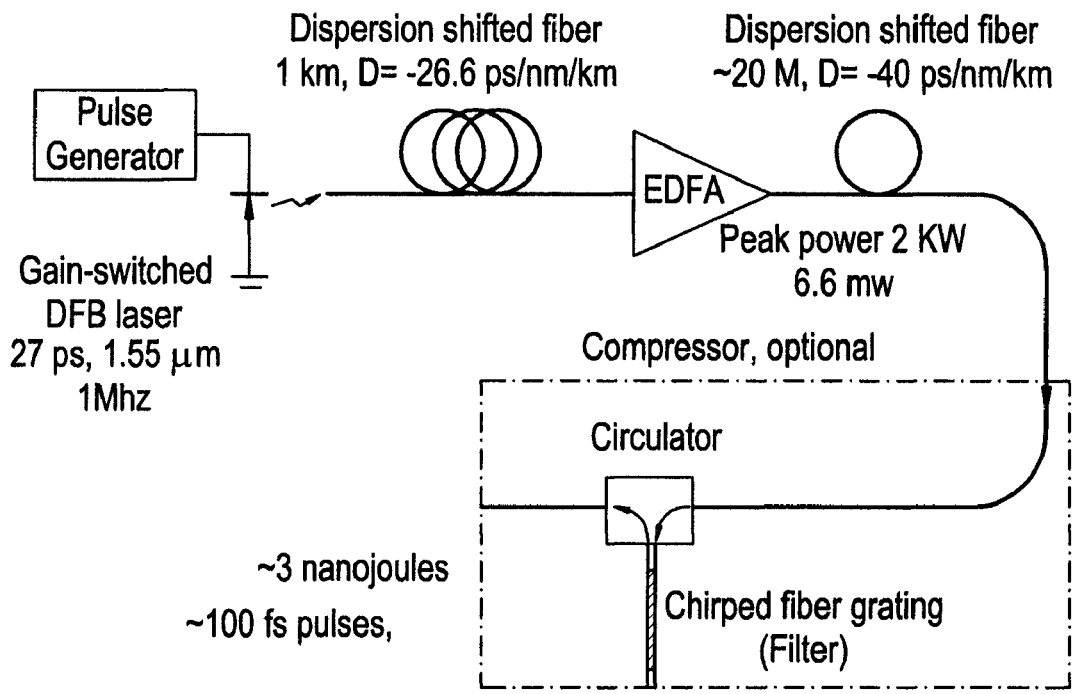
FIG. 2 is an illustrative diagram of a first embodiment of the present invention.

In the first embodiment shown in FIG. 2, a gain switched laser diode as is described in Ahmed et al is used as the source 1. The chirped 27 picosecond pulse from DFB laser diode at 1550 nm is recompressed to about 3.3 ps in a dispersion shifted fiber 2. This is about 1 km long with D=−26.6 ps/nm/km. The pulse is now about 2× transform limited. The chirp compensation is sufficiently accurate as is described in Mestadagh, D., "Fiber-grating pulse compressor: Performance with initially chirped pulses" Applied Optics 26, pp. 5234-5240, (1987). These pulses are then amplified in an erbium fiber amplifier (EDFA) 3 with a gain of approximately 30 db up to 2 kW peak power. The amplifier is designed so little self-phase modulation takes place in the amplifier. This can be accomplished with a short fiber length (~10 M) and a large effective area of the mode (~100 μm²). The rest of the fiber pulse compressor consists of an undoped fiber 4. The primary constraint on this fiber is positive GVD. One example is the Lucent Ultrawave IDF, as is described in (Knudsen, S. "Design and manufacture of dispersion compensating fibers and their performance in systems", Proc. of OFC '02, paper WU3, 330-331 (2002)). The optimum length, $Z_{opt}$, of the undoped fiber should be ~20 M for a compression factor of around 50 and a target pulse width around 100 fs. The energy of the amplified pulse is 6.6 nanojoules. If the rep-rate for this source is 1 MHz, then the average power from this amplifier is a modest 6.6 mW.

With these design parameters it is useful to show that this method is impractical for telecom systems. If this nonlinear fiber were part of a telecom source at 10 GHz, then the output would be an unreasonable 66 Watts. At the same average power of 6.6 mW which is reasonable for a telecom system, the peak power for a 10 GHz telecom source would be reduced by four orders of magnitude. At this peak power, spectral broadening does not occur in the fiber so the disclosed pulse compression method would not work.

Returning to the invention, spectral generation occurs by self-phase modulation in the fiber. Self-phase modulation is proportional to the rate of change in the intensity. As the positive dispersion spreads out the pulse, at the leading and falling edge of the pulse, spectrum is generated. Blue shifted components of the spectrum are generated at the trailing edge of the pulse and red shifted components are generated at the leading edge of the pulse. The pulse ends up being temporally rectangularly shaped.

The stretched pulse can now be compressed or stretched with a grating 5 as is shown in FIG. 2. A circulator 6 is used to transit the pulses into and out of the fiber grating. The pulse would be stretched in the case of subsequent amplification by a chirped pulse amplification system, or compressed for output if there is no subsequent amplification stage.

In past fiber compression systems, the grating for compression has been a bulk grating. One design is described in (Kafka et al, "Pulse Compression" U.S. Pat. No. 4,750,809). However, a problem has been that the difference from linear group velocity dispersion for bulk gratings does not match that for the stretched pulse. (Tomlinson et al, "Limits of fiber-grating optical pulse compression" JOSAB 4 pp. 1404-11, (1987)). It has been shown that fiber gratings are a better match than the bulk gratings in (Williams et al, "The compression of optical pulses using self-phase modulation and linearly chirped Bragg-gratings in fibers" IEEE Photonics Technology, pp. 491-3, (1995)). The fiber grating has several other advantages. In (Kafka et al, "Peak power fluctuations in optical pulse compression" U.S. Pat. No. 4,896,326) it has been shown that amplitude fluctuations can lead to pulse width fluctuations. This patent describes a feedback circuit for controlling the input laser for correcting these fluctuations. However, pulse width fluctuations could be corrected by varying the chirp of the fiber grating. This method is being applied for correcting dispersion fluctuations in telecom systems as is described in (Kwon et al "Group-delay-tailored chirped fiber Bragg gratings using a tapered elastic plate" IEEE Photonics Technology Letters, 14, pp. 1433-1435, (2002)). In this work the chirp is tailored by adjusting the strain on the fiber grating. Another means of adjusting the chirp is by adjusting the temperature along the grating. Another advantage is that the bandwidth of the gratings can be designed to act as a filter. It has been shown that by cutting the extremes of the spectra that pulse quality can be improved in this pulse compression means. ((Heritage, "Spectral windowing of frequency-modulated optical pulses in a grating compressor", Applied Physics Letters, 47, pp. 8789 (1985)).

Various methods for removing a pedestal from short pulses can also be applied in this embodiment of the present invention. Such methods include frequency doubling, the use of a nonlinear loop mirror, and nonlinear polarization rotation in a fiber and in hollow waveguides filled with a noble gas.

Figure 3:
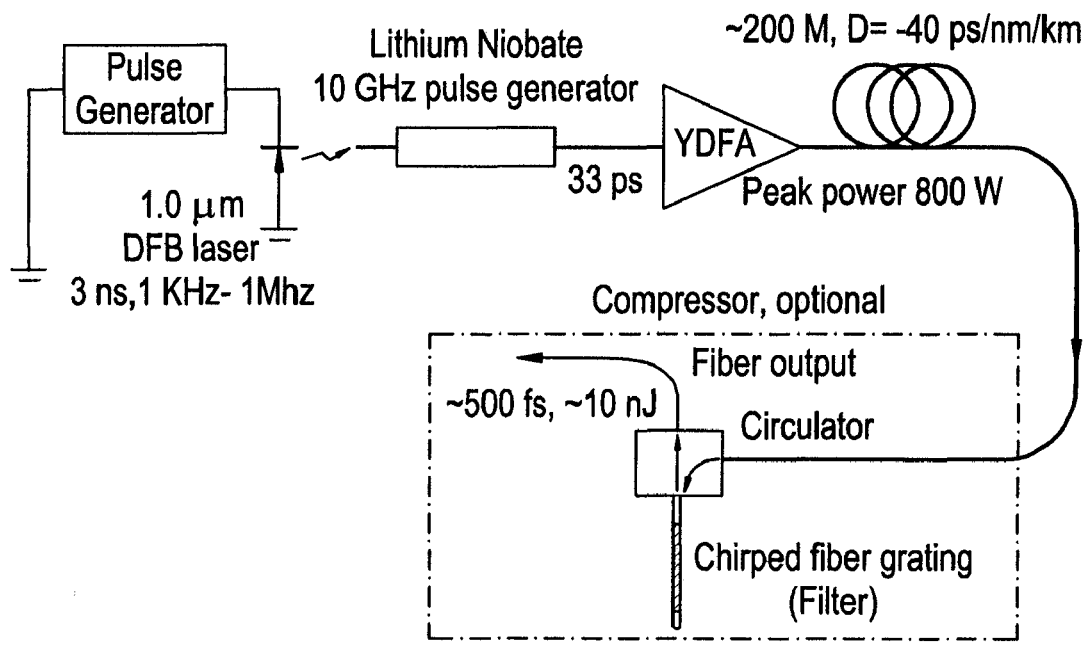
FIG. 3 is an illustrative diagram of a second embodiment of the present invention.

In the second embodiment as is shown in FIG. 3, the short pulse from the laser diode is generated by a method other than gain switching the laser diode. The technique employed here is an external lithium niobate modulator 32 after a cw laser diode 31. The advantage with this method is that little chirp is imparted on the pulse so that chirp compensation is not necessary. This method is commonly used in the telecommunications field. However, one specification that is more critical for this application than for telecommunications is the extinction ratio. The typical extinction ratio for a lithium niobate modulator is 20-30 db. This specification can be found from the data sheet for JDSU model no. 21013142. If this modulator is turned on to give a 100 ps pulse at a 10 kHz pulse rate, then the pulse is on for 100 ps while the cw is on for 0.1 ms. This means that the cw component is on the order of 10⁵ longer than the pulse. If the cw amplitude is cut by just 30 db, the average power will still be dominated by this cw component. At higher repetition rates two modulators can be used and will be sufficient. Another approach is to gate the cw laser and have it on for a short time during the pulse. If the laser diode is gated on for about 3 ns while the modulator is switched then the extinction ratio is not critical. Any other means to create a short pulse from a laser diode can be considered. Another possibility is an electroabsorption modulator (not shown) after the diode.

In this embodiment (FIG. 3), the pulses are amplified in an Ytterbium doped fiber amplifier (YDFA) 33. The compressor fiber 34 is the same fiber as in the first embodiment but approximately 200M long, compared to 20M. The fiber is longer than that in the first embodiment for two reasons. The first is the initial pulse width is an order of magnitude longer. The second reason is that the peak power is lower. Since the initial pulse width is longer, it may be desirable to have a second stage of compression. This is easily implemented in the fiber grating/circulator configuration 35 shown in FIG. 3. The fiber output from the circulator can be designed as the second compression fiber. The first stage was designed for a compression factor of near 80 so pulses around 0.5 picoseconds are expected. The second stage will be designed for 10× additional compression. This design can be implemented by adding an additional of 40 cm of the same fiber as was used in the first compression stage. The amplitude of the pulse will need to be controllable and lowered by about a factor of 4. To this end, an attenuator can be placed in the circulator. The pulses can be used stretched for further amplification, or compressed by an external bulk grating after this second fiber compressor.

Figure 4:
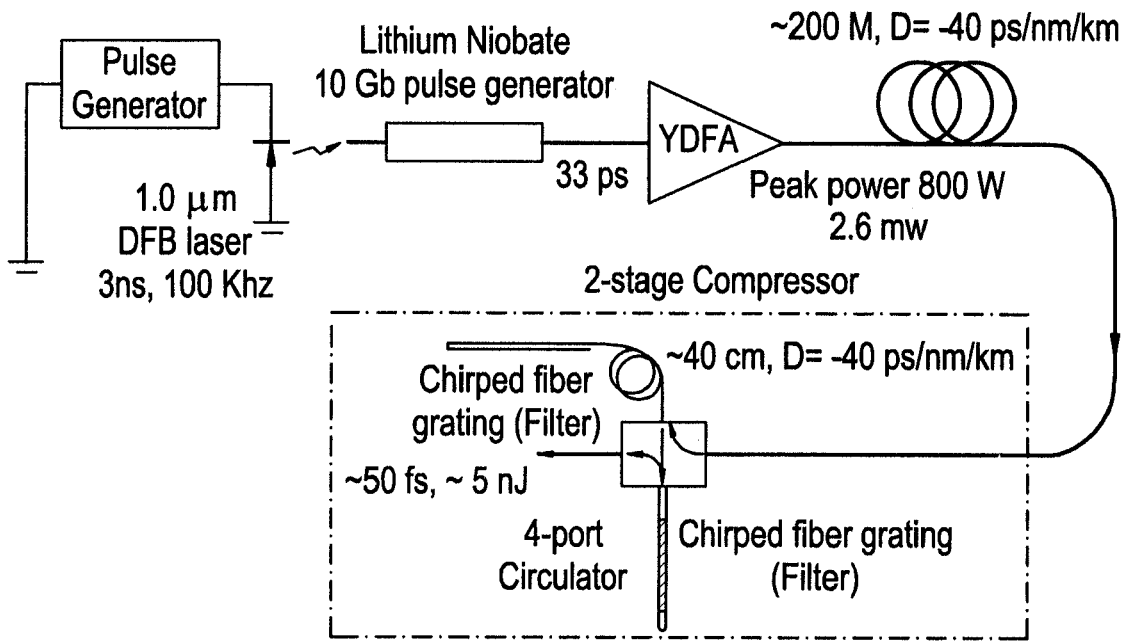
FIG. 4 is an illustrative diagram of a third embodiment of the present invention.

Another configuration for a two-stage compressor is shown in the third embodiment in FIG. 4. It utilizes a four-port circulator 45 with an additional fiber grating 47. The second fiber compressor is spliced in front of the first fiber grating. The first pass through the extra 40 cm of fiber has negligible effect since the pulse is stretched. After the second pass through this compressor fiber, additional spectrum is generated and the pulse can be further compressed in the second chirped fiber grating.

Figure 5:
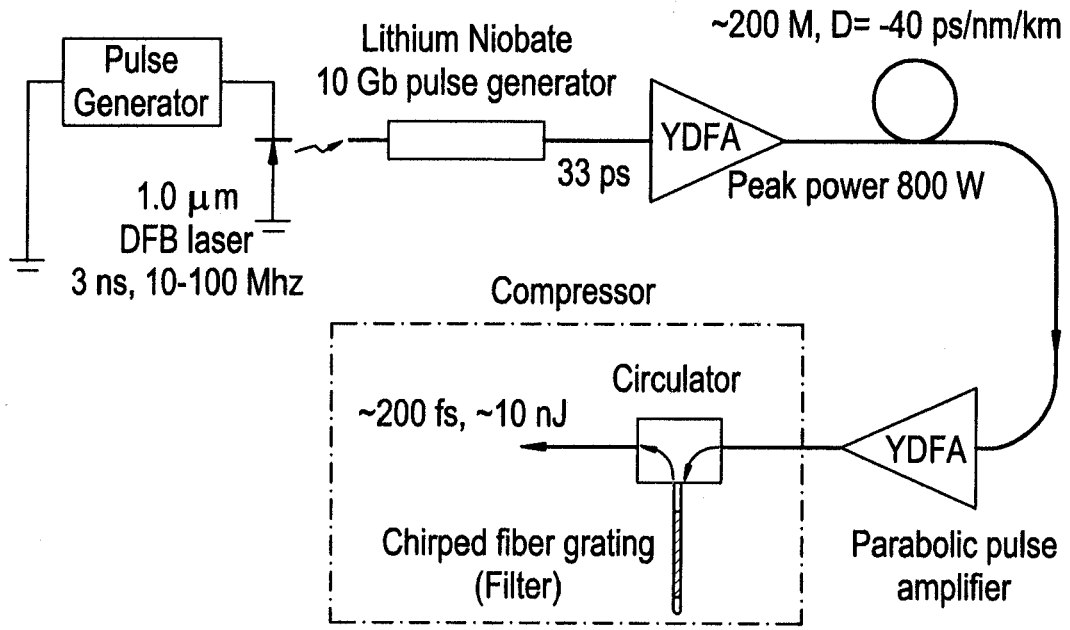
FIG. 5 is an illustrative diagram of a fourth embodiment of the present invention.

The forth embodiment of this invention (shown in FIG. 5) includes an additional amplifier 58. It is desirable for the amplifier to operate as a parabolic pulse amplifier. The use of parabolic pulse amplification has unique advantages after the pulse compressor fiber 34. The advantages come from the fact that as the pulse energy increases at a given rate with propagation, the peak power increases at the square root of that rate because the spectral and temporal width is increasing at the square root of that rate. Thus, higher pulse energy is possible before the threshold of Raman generation. Also, since the pulse from the parabolic pulse amplifier is further spectrally broadened and is compressible, further compression is possible after the compression fiber. It is normally considered necessary to recompress the pulse after the pulse compression fiber for further compression of the pulse. This is the reason for the two stage compressor in the third embodiment. A parabolic pulse amplifier can replace one of the stages of compression and alleviate the need for a second grating compressor. This is a distinct advantage.

Another configuration within this embodiment is to replace the two ytterbium amplifiers and the 200 meters of compression fiber with a single amplifier and 100 meters of pulse compression fiber connected to the amplifier. This amplifier and pulse compression fiber is double passed in this variation.

In order for the system to include a parabolic pulse amplifier, it is necessary to transform the pulse shape from the laser diode into a pulse with a parabolic temporal shape and a linear spectral chirp. The first step in this process is the amplification of the pulse in a doped fiber to a sufficient pulse amplitude such that self-phase modulation takes place in the fiber. The self-phase modulation needs to be sufficiently strong that the pulse profile transforms from being the same spectrum along the temporal profile, to the spectrum being a function of time. The final transformation is the temporal profile change from that of the initial pulse, to near parabolic, this caused by more energy being accumulated where the self-phase matching is the strongest. This process does take place in the undoped fiber in the first embodiment and the pulse shape from this undoped fiber is sufficiently close to a chirped, parabolic pulse to be the input into the parabolic pulse amplifier. It has been shown theoretically and experimentally that the pulse does not need to be a perfect parabolic pulse. Thus, the first section of the amplifier is a linear amplifier without nonlinear effects. The second section utilizes self-phase modulation and dispersion to transform the pulse into a pulse shape close to parabolic with linear chirp. This section can be an amplifier or an undoped fiber. The final section is the parabolic pulse amplifier.

This embodiment of the invention can be operated near 100 MHz so as to replace the standard Nd:YAG or Nd:Vanadate mode-locked laser, or the newer mode-locked lasers such as in (Kafka et al, U.S. Pat. No. 6,421,573, "Mode-locked laser and amplifier").

To obtain different wavelengths of output frequency, conversion crystals can be used after this laser. Thus this laser can be used in the UV for detecting flaws on a surface as in U.S. Pat. No. 6,373,565 "Method and apparatus to detect a flaw in a surface of an article", or to repair a defect in an electronic device as in U.S. Pat. No. 6,436,602 "Method of repairing a defective portion in an electronic device" or for photolithography as in U.S. Pat No. 6,421,573 "Quasi-continuous Wave lithography Apparatus and Method". Thus, laser can be used in replacement of most types of mode-locked lasers with the advantage of being synchronizable to an event. For example, in repairing a flaw, once the beam is positioned to the right spot, a pulse or train of pulses can be fired.

A fifth embodiment uses a laser diode that is spectrally and temporally chirped electronically. The pulse source being temporally chirped in the time domain by electronic means is described in U.S. Pat. No. 5,4000,350, and details on optimizing the electrical tuning of the laser diode is described in U.S. Pat. No. 5,633,885. The pulse shape from this diode is sufficiently close to a parabolic pulse shape that they can be amplified in a parabolic pulse amplifier. This will generate additional spectrum so the pulses can be compressed to below the 2 ps that was obtained previously.

Figure 6A:
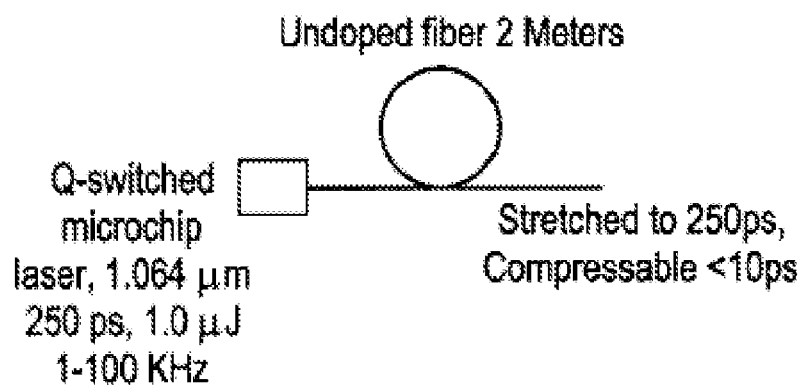
FIGS. 6A and 6B are illustrative diagrams of a sixth embodiment of the present invention.
Figure 6B:
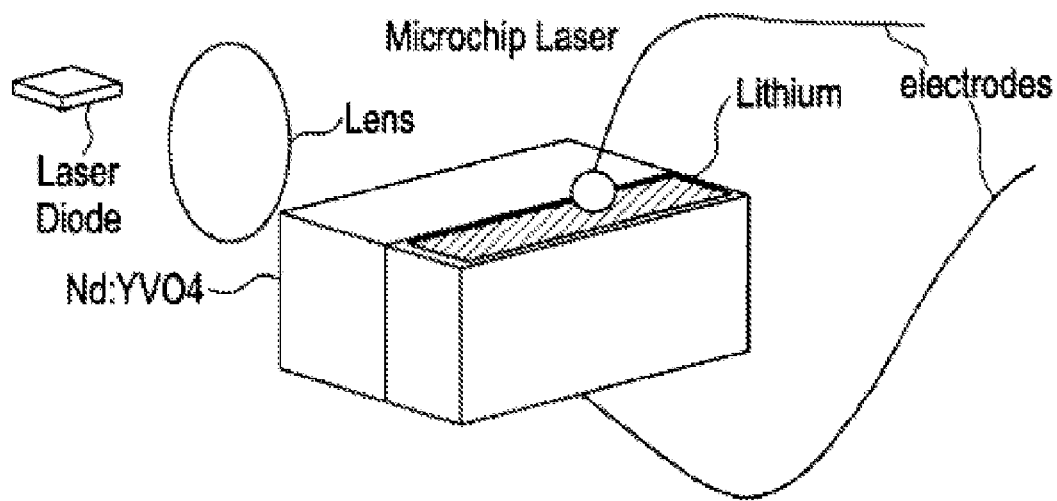

A sixth embodiment of the invention is shown in FIG. 6A and includes a Q-switched microchip laser 60 (as shown in FIG. 6B) as the pulse source 61 and a compression fiber 62. In the cases where the pulse width is short the lasing material has been Nd:Vanadate. The lasing wavelength of Nd:Vanadate is 1064 nm. The microchip laser is a monolithic piece, where the lasing material is bonded to the Q-switching mechanism. The cavity length measures around one millimeter. Thus, a Q-switched laser can give pulse widths as short as a cw mode-locked Nd:YAG laser and can replace the mode-locked lasers for the source where fibers are used for compression. One of the advantages with the microchip laser is that the repetition rate can be varied. It can have a low rep rate so the pulse energy is on the order of 1 microjoule compared to nanojoules from the mode-locked laser. Another advantage with this microchip laser is the cavity is monolithic so the output pointing stability is very good, and the alignment to a single mode fiber is robust. This was a large problem with systems based on cw mode-locked lasers.

The microchip laser in this embodiment has a pulse width of 250 ps. With this pulse width, a design similar to the earlier embodiments is not possible, unless a fiber is used that inhibits Raman generation. There is a different design point for longer pulses and shorter fibers where GVD is negligible. This was studied theoretically in (Tomlinson et al, "Compression of optical pulses chirped by self-phase modulation in fibers" Journal of the Optical Society of America B, pp. 139-149, (1984)). A product was based on this design and is described in (U.S. Pat. No. 4,913,520, U.S. Pat. No. 4,896,326 and Kafka et al "Peak power fluctuations in optical pulse compression", IEEE Journal of Quantum Electronics 24, pp. 341-50 (1988)). The design for this compression fiber can be facilitated with the equations in (Govind P. Agarwal, Nonlinear Fiber Optics, Academic Press Inc. Boston 1989 Chapter 4). The maximum phase shift, $\Phi$, is at the peak of the pulse with a peak power of $P_0$.

$$\Phi_{max} = \gamma P_0 L_{eff}$$

$\gamma$ and $L_{eff}$ are defined above. For a Gaussian shaped pulse that is a good approximation of the microchip pulse, the ratio of spectral width generated, $\delta\omega_{max}$, to the initial pulse, $\Delta\omega$, width is:

$$\delta\omega_{max}/\Delta\omega = 0.86\ \Phi_{max}$$

If the initial pulse is transform limited, and the self-phase modulated pulse can be compressed near-transform limited, then this ratio is the compression factor.

Thus in the sixth embodiment (FIG. 6) the microchip laser is a single longitudinal Nd:vanadate source that provides a smooth temporal profile. The pulse width is 250 picoseconds. One solution for the compression fiber 62 is a standard single mode fiber with a mode field diameter of 5.9 µm and a NA of 0.12. The length of this compression fiber would be about 2 meters for a compression ratio of around 50. The output energy from microchip lasers can be 10 microjoules. In this case, the light intensity at the entrance face of the fiber will be near the damage threshold. A coreless end cap (not shown) can be used on the fiber so the mode can expand before the surface of the fiber. Otherwise, an amplifier with a larger mode field diameter can be used, such as a multimode fiber that propagates a single mode or a holey fiber amplifier as was used in (Furusawa et al "Cladding pumped Ytterbium-doped fiber laser with holey inner and outer cladding", Optics Express 9, pp. 714-720, (2001)). If a fiber with an order of magnitude higher mode area (mode field diameter of 19.5 µm) is used, then the parameters in the fiber will be the same as in the case with 1 microjoule input. So the fiber length would again be 2 meters.

Figure 7:
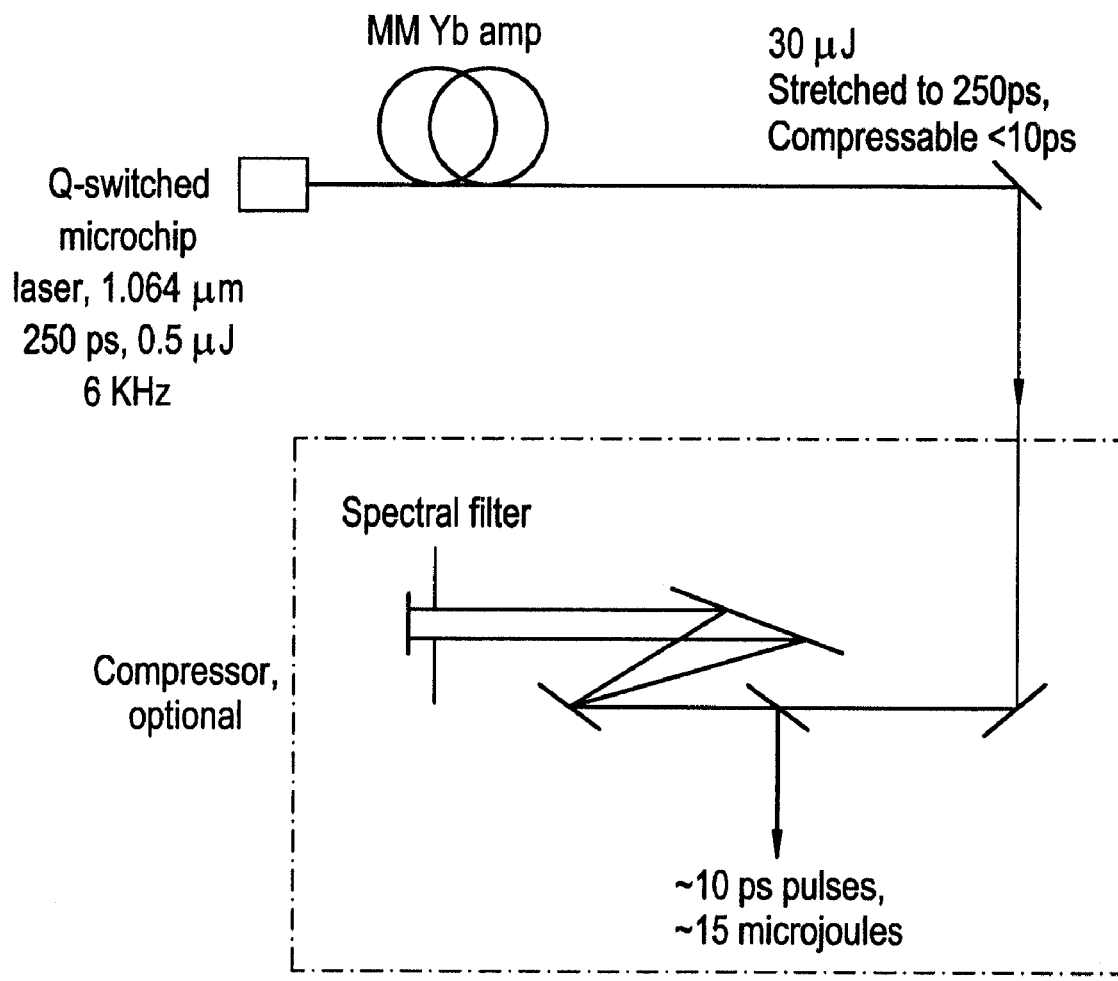
FIG. 7 is an illustrative diagram of a seventh embodiment of the present invention.
Figure 8:
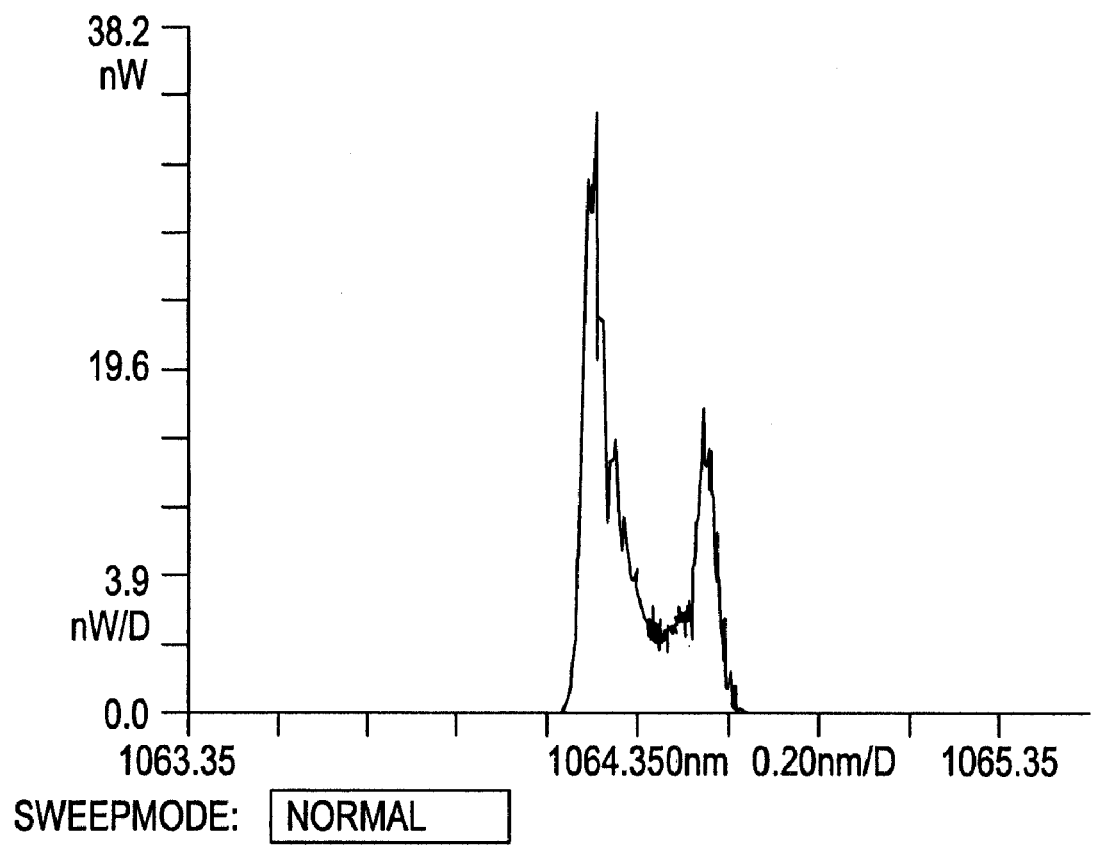
FIG. 8 shows an example of the spectral output at the output of amplifier illustrated in FIG. 7
Figure 9A:
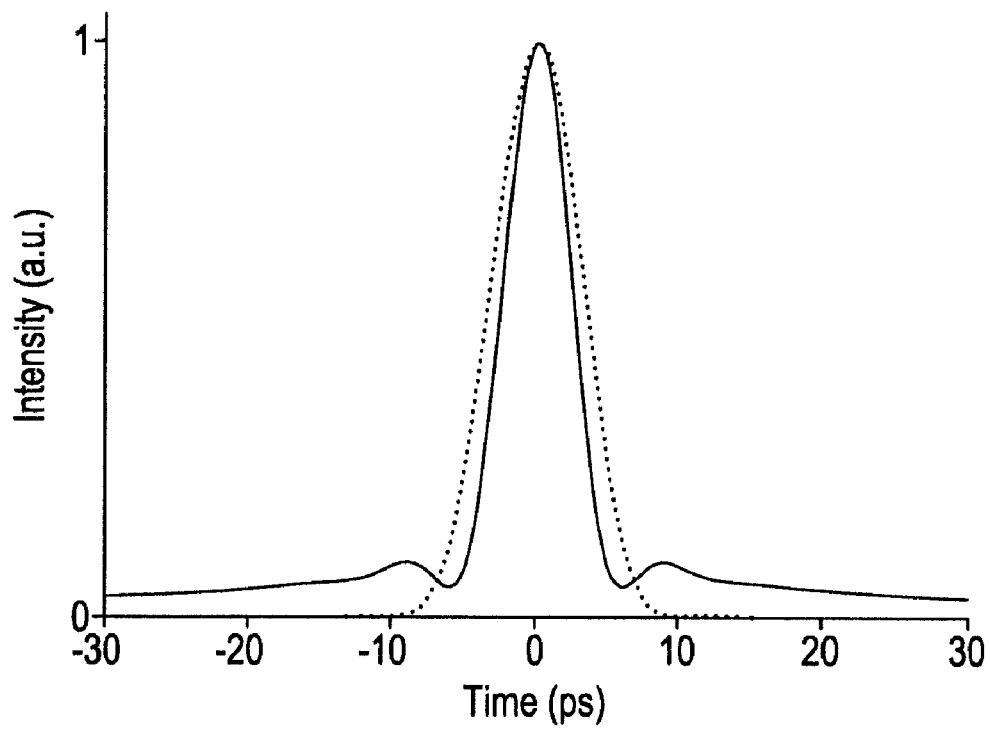
FIGS. 9A and 9B show an example of a pulse according to the seventh embodiment, compressed with a bulk grating.
Figure 9B:
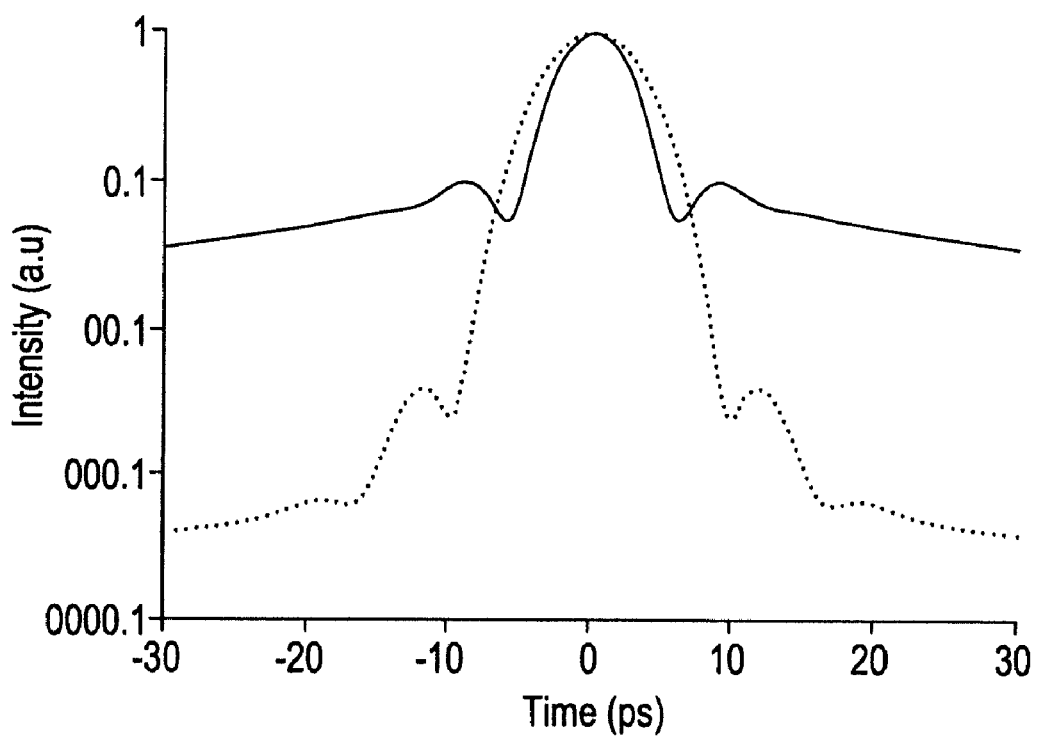

Since there is no interplay between dispersion and self-phase modulation in this design, the pulse compression can take place simply in amplifiers. For pulse energies significantly greater than 1 microjoule, the single mode beam should be further amplified in a multimode fiber. If further amplification were desired, it would be preferable to keep the pulse stretched. This chirped pulse source would be ideal for amplification of ultrashort pulses by chirped pulse amplification. The pulse is then compressed after amplification. This is the seventh embodiment as shown in FIG. 7. Here, the microchip 71 was operated at 0.5 µJ, and produced 250 ps, pulses at 6 kHz. The amplifier fiber 72 was a multimode amplifier fiber that amplified a single mode with a mode-field diameter of 17 µm. The pulse was then amplified to 30 microjoules where Raman limited the amplification. The spectral output is shown in FIG. 8 at the output. The input spectral width (0.007 nm) is below the resolution limit (0.1 nm) of the spectrum analyzer. This case was numerically modeled and it was found that this pulse should compress with bulk gratings to ~7 ps as is shown in FIGS. 9A and 9B. The dotted lines show the results of spectrally filtering the output to reduce the pedestal.

In the embodiment shown in FIG. 7, a compressor 73 may also be employed as an option.

Figure 10:
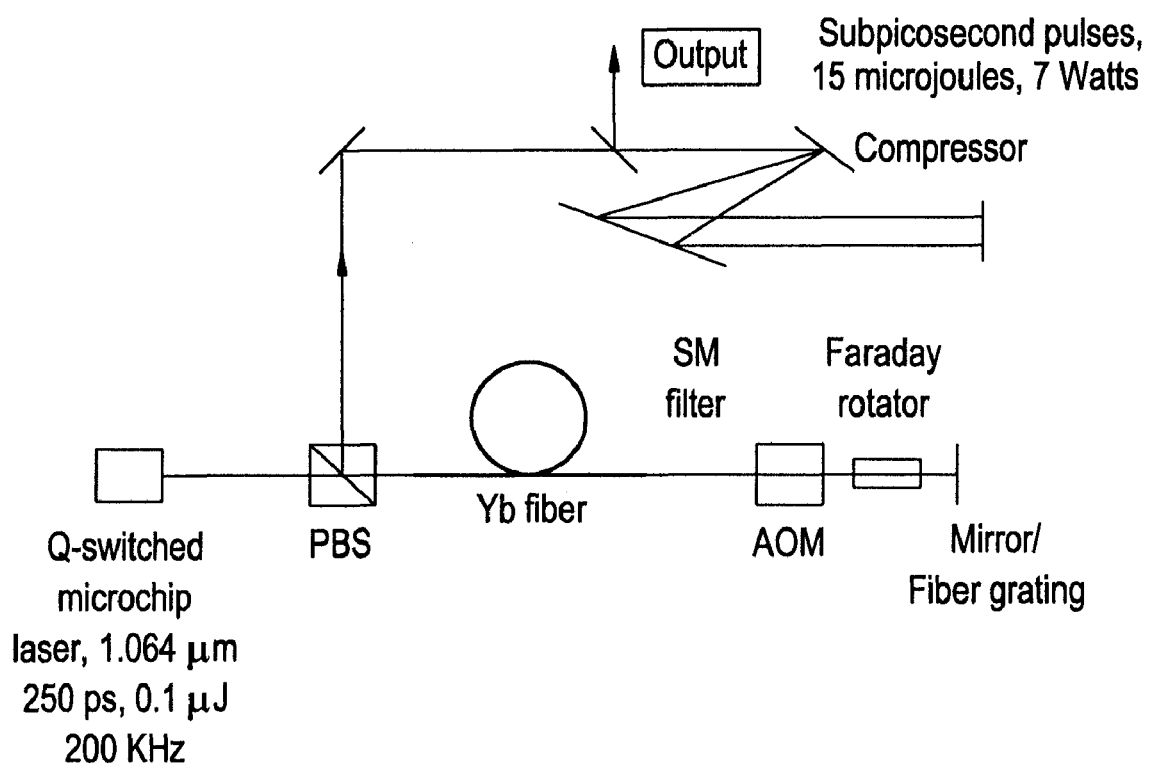
FIG. 10 is an illustrative diagram of an eighth embodiment of the present invention.

An eighth embodiment, illustrated in FIG. 10, utilizes the same amplifier fiber 103, as in the seventh embodiment, however, in a double pass configuration. Double pass configurations can be used for the amplifiers and the pulse compression fibers to maintain single polarization operation for non-PM fiber. Also, the amplifier can operate in a lower gain and higher power mode. The amplifier fiber can be used as a pulse compression fiber in both directions. If this is the case, a fiber grating may be desired in place of the mirror 104.

The fiber grating can be used to control the temporal shape of the pulse. The pulse is now chirped, therefore changing the reflectivity of the fiber grating as a function of wavelength will shape the pulse. Thus, by changing the shape of the pulse, the linearity of the chirp of the output can be changed to better match that of the bulk gratings. This method has been described by adding a amplitude mask in a bulk grating in (Thurston et al, "Analysis of picosecond pulse shape synthesis by spectral masking in a grating pulse compressor" IEEE Journal of Quantum Electronics, QE-22 pp. 682-696 (1986)).

The seventh and eighth embodiments, which include a microchip laser and an amplifier will exhibit output powers greater than 500 nJ.

An application for the pulse compressed microchip laser is to pump a gain switched laser. In (Harter et al, "Short pulse generation from Ti:doped Materials" Digest of Conference on Lasers and Electro-Optics (Optical Society of America, Washington, D.C. 1988), p 466-7) a 100-200 ps pulse could be generated from a gain switched Ti:sapphire laser. This laser was pumped by a 5 ns pulse from a Q-switched, frequency-doubled Nd:YAG laser. This work was referenced and described in (Zayhowski et al, "Gain-switched pulsed operation of microchip lasers" Optics Letters, 14, pp. 1318-20). In this work, the gain-switched Nd:YAG laser that generated 80 ps pulses, and was pumped with a gain switched Ti:sapphire laser that was pumped with a Q-switched, frequency doubled Nd:YAG laser. More recently in (Zayhowski "Laser system including passively Q-switched laser and gain-switched laser", U.S. Pat. No. 6,400,495) a gain switched Ti:sapphire laser that is pumped with a passive Q-switched, frequency doubled Nd:YAG laser is claimed. There are no experimental results, but the document points out that the pump pulse should be shorter than 5× the pulse from the gain switched laser. The reason for this ratio of pulse widths can be intuitively understood. The build-up time for a gain switched (Q-switched) laser is about 10× its pulse width. So if the pulse width of the pump laser is 5× longer than the gain switch pulse, all the energy goes into that single pulse. In the Harter paper referenced above, the pump pulse was 25×-50× longer than the gain switched pulse. In this work, if the laser is pumped hard, multiple pulses were obtained. Also, the gain switch pulse came out at the peak of the pump pulse so about half of the pump pulse energy is wasted.

In order to get pulses that are shorter than 100 picoseconds, a shorter pump pulse is highly desirable. For pulses shorter than 10 ps and, particularly, femtosecond pulses, the pulses from the typical microchip are definitely too long for the pump laser. To get pulses shorter than 10 ps, the pulse-compressed microchip laser can be used as a pump. However, to get subpicosecond pulses from a gain switched laser requires more than just a short pump pulse. The time it takes light to travel around the laser cavity must be shorter than the required pulse width. Thus, to get less than 10 picosecond pulses, the cavity would need to be shorter than c×2×L×n, where c is the speed of light, L is the cavity length and n is the refractive index of the material in the cavity. Thus, for the Ti:sapphire gain switched laser in the Harter paper, the length of the crystal would need to be at least an order of magnitude shorter than the 5.5 mm used and, thus, 500 μm or less. However, for this thickness it is difficult to absorb pump light. The problem with absorbing pump light in a very thin laser material has been solved in (Brauch et al, "Laser Amplifying System" U.S. Pat. No. 5,553,088). The amplifier design uses a very thin material that has good absorption. However, with very thin discs, multiple passes of the pump is necessary. Table 1 in U.S. Pat. No. 5,553,088 gives a list of materials with suitable absorption numbers. Ti:sapphire(Ti:Al$_2$O$_3$) is one that is listed. In order to use a 500 μm disc, the pump will need to make 8 passes through the material. In U.S. Pat. No. 5,553,088, the eighth embodiment illustrated in FIG. 28 shows a configuration with 8 passes through the material. Eight passes is a complex device, fewer double passes would be more reasonable. The additional constraint is that the time to transit the optical path length needs to be on the order of the pump pulse width. With a short cavity, it is difficult to obtain a large diameter mode. The repetition rate is low so that the overall thermal load will be low, so thermal lensing will not help to support a large diameter single mode. The use of longer cavities and thermal lensing in order to support large modes in thin semiconductors is described in (Mooradian et al, "Optimized laser energy conversion through automatic mode matched pumping" U.S. Pat. No. 5,627,853) However, the gain in this gain switched laser is significantly higher than that in cw lasing, so that gain guiding will take place and support a large diameter single mode. The use of gain guiding to support large transverse modes is used in fibers in U.S. Pat. No. 5,818,630.

To summarize, the invention has the following attributes:
Use of pulse compressed microchip as a pump to get high energy pulses less than 10 ps from a gain switched laser.
Use of multiple passes for absorption where the temporal path length is on the order of the pump pulse width.
Use of gain guiding for a thin stable flat cavity without thermal lensing.

While various implementations of variable rep-rate source for high energy, ultrafast lasers according to the present invention have been described in detail, a skilled artisan will readily appreciate that numerous other implementations and variations of these implementations are possible without departing from the spirit of the invention.

For example, the source of pulses can have a large range of pulse widths. A practical limitation is the grating utilized for compression. One meter long fiber gratings have been made that can compress 10 nanosecond pulses. Thus, some implementations of the invention may utilize pulses of up to about 10 nanoseconds. On the other hand, bulk grating compressors have been built that compress 4 nanosecond pulses. Accordingly, some advantageous implementations of the present invention may utilize pulses which are up to about 4 nanoseconds. Also, at present, 10 cm fiber gratings and bulk compressors that compress 1 nanosecond pulses are readily available. Thus, some particularly advantageous implementations of the invention may utilize pulse widths up to about 1 nanosecond.

The scope of the invention is defined by the claims set forth below.

What is claimed is:

1. A system comprising:
a non-mode-locked source laser generating output pulses, said non-mode-locked source comprising a cw laser diode and a lithium niobate electro-optic modulator disposed at an output of said cw laser diode, wherein said cw laser diode is selectively gated on to generate optical pulses at a repetition rate in the KHz to MHz regime, said modulator receiving said optical pulses and generating modulated output pulses;
a fiber with positive group-velocity dispersion (GVD) and capable of imparting self-phase modulation to an output of said non-mode-locked source, and producing output pulses compressible to pulse widths of about 10 ps or less; and
a pump source for pumping said non-mode locked source, wherein at least a portion of said pump source comprises an electrical pulse generator configured to selectively gate said laser diode.

2. The system according to claim 1, wherein a compressible output pulse comprises a pulse having a pulse width of about 250 ps.

3. The system according to claim 1, further comprising a compressor receiving a compressible output from said fiber and producing a compressed output pulse having a pulse width less than about 10 ps.

4. The system according to claim 1, further comprising a gain switched laser pumped by an output of said compressor.

5. The system according to claim 1, wherein said pump source is gain-switched.

6. The system according to claim 1, wherein said fiber comprises a single-mode fiber.

7. The system according to claim 1, wherein said fiber comprises a coreless end cap, whereby a mode is expanded before a surface of said fiber.

8. The system of claim 1, wherein said non-mode-locked source comprises a microchip laser.

9. The system of claim 1, further comprising a conversion crystal disposed downstream from said fiber for varying the wavelength of an output of said system.

10. The system according to claim 9, wherein said system having said conversion crystal is configured to operate in the UV spectrum.

11. The system according to claimed in claim 1, wherein said fiber is a single mode fiber having a length of approximately 2 meters for a compression ratio of approximately 50.

12. The system according to claim 1, wherein said repetition rate is in the range from about 10 MHz to 100 MHz.

13. The system according to claim 1, wherein said repetition rate is in the range from about 1 KHz to 1 MHz.

14. The system according to claim 1, wherein a wavelength of said CW laser diode is about 1 μm or about 1.55 μm.

15. The system according to claim 1, further comprising a fiber amplifier disposed downstream from said non-mode-locked source laser.

16. The system according to claim 1, wherein an extinction ratio of said modulator is in the range from about 20-30 dB.

17. The system according to claim 1, wherein a cw power component of the average optical power is insubstantial as a result of said selectively gating of said laser diode.

18. The system according to claim 1, wherein said fiber comprises a multimode fiber.

19. The system according to claim 1, wherein said multimode fiber is configured to propagate a single mode beam.

20. The system according to claim 1, wherein said fiber comprises a holey fiber.

21. The system according to claim 1, wherein said fiber comprises a multi-mode, Yb gain fiber configured as a Yb fiber amplifier.

* * * * *